United States Patent [19]

Eguchi et al.

[11] Patent Number: 5,084,410
[45] Date of Patent: Jan. 28, 1992

[54] METHOD OF MANUFACTURING SEMICONDUCTOR DEVICES

[75] Inventors: Kazuhiro Eguchi; Tetsuo Sadamasa, both of Kanagawa; Hideto Furuyama, Tokyo; Yuzo Hirayama, Kanagawa, all of Japan

[73] Assignee: Kabushiki Kaisha Toshiba, Kawasaki, Japan

[21] Appl. No.: 257,519

[22] Filed: Oct. 14, 1988

[30] Foreign Application Priority Data

Oct. 15, 1987 [JP] Japan .................. 62-260099
Oct. 16, 1987 [JP] Japan .................. 62-261188

[51] Int. Cl.⁵ .......................................... H01L 21/205
[52] U.S. Cl. .......................................... 437/90; 437/40; 437/81; 437/89; 437/107; 437/110; 437/126; 437/127; 437/129; 437/133; 437/203
[58] Field of Search ............... 148/DIG. 86, 50, 51, 148/56, 65, 72, 110, 169; 156/610–614, 644, 647, 662; 437/40, 81, 89, 90, 107, 110, 126, 127, 129, 133, 203, 905, 912, 945, 970

[56] References Cited

U.S. PATENT DOCUMENTS

| 3,425,879 | 2/1969 | Shaw et al. | 437/90 |
| 3,559,005 | 1/1971 | Vandelin et al. | 437/90 |
| 3,752,714 | 8/1973 | Ito et al. | 437/90 |
| 4,017,885 | 4/1977 | Kendall et al. | 357/51 |
| 4,354,898 | 10/1982 | Coldren et al. | 156/662 |
| 4,455,074 | 6/1984 | Iwai | 156/649 |
| 4,613,387 | 9/1986 | Turley | 372/46 |
| 4,665,525 | 5/1987 | Ackley et al. | 437/203 |
| 4,788,159 | 11/1988 | Smith | 437/90 |
| 4,789,643 | 12/1988 | Kagikawa | 437/90 |
| 4,839,307 | 6/1989 | Imanaka et al. | 156/612 |

FOREIGN PATENT DOCUMENTS

| 0001221 | 1/1982 | Japan | 437/90 |
| 0110186 | 6/1984 | Japan | 437/90 |
| 0318732 | 12/1988 | Japan | 437/90 |

Primary Examiner—Brian E. Hearn
Assistant Examiner—Ken Horton
Attorney, Agent, or Firm—Oblon, Spivak, McClelland, Maier & Neustadt

[57] ABSTRACT

A semiconductor device which comprises a semiconductor substrate having a surface orientation substantially in a {100}-orientation is provided. On the semiconductor substrate, plural steps formed in a direction deviated substantially from a <110>-direction by 5 degrees or more are formed. The steps, which are mesa and concave portions, are buried by plural semiconductor crystal layers grown by the use of MOCVD or the like. A method of manufacturing such a device is also provided.

3 Claims, 5 Drawing Sheets

METHOD OF MANUFACTURING SEMICONDUCTOR DEVICES

BACKGROUND OF THE INVENTION

1. Field of the Invention

This invention relates to a semiconductor device, and more particularly to a semiconductor device having step portions on the surface of the semiconductor substrate. This invention also relates to a method of manufacturing such a device.

2. Description of the Prior Art

In the process of manufacturing semiconductor devices such as semiconductor laser diodes, step portions such as mesa patterns or concave portions formed on a semiconductor substrate must be buried by growing semiconductor crystal layers. It is generally known that a liquid phase epitaxial growth method can effectively grow semiconductor crystal layers so as to bury such step portions. As a result, the surface of the semiconductor substrate becomes flat. However, when this crystal growth is performed by a vapor phase epitaxial growing method, a problem will arise.

Specifically, in the case when the thickness of steps are less than 1 μm, there is substantially no problem. When the thickness of such steps are greater than 1 μm, however, mesa patterns cannot be satisfactorily buried. This is because some projections grow from the sides of steps. These projections prevent the crystal growth (as disclosed in the transactions of Electronics and Communications conference, 865, spring 1987; and Applied Physics conference, 30 p, ZH-8, spring 1987).

As described above, mesa patterns are formed on a semiconductor substrate as steps. Thereafter, semiconductor crystal layers are grown on such steps. In the conventional process, the substrate surface is in a plane of {100}-orientation. One of mesa patterns is formed in a <110>-direction. The direction of such a mesa pattern is inevitably determined in the <110>-direction. The reason is that when manufacturing a semiconductor laser diode, the longitudinal direction of the mesa pattern is determined so as to intersect perpendicularly to a (110)-plane. The (100)-plane is a resonator side formed by a crystal cleavage. When the longitudinal direction of the mesa pattern is formed in the <110> direction, a plane of {111}-orientation appears on the side of the mesa pattern. Thus, a projection grows in a direction parallel to a {111}-plane.

Therefore, in the conventional method, to avoid the above-described problem, the process of forming a mesa pattern and burying the same is divided into small processes. Specifically, the step of mesa pattern is limited to 1 μm or less at a time. However, this method requires a large number of times of crystal growth. Thus, the process becomes cumbersome and complicated. Moreover, when designing the devices, various restrictions are inevitably imposed on the configuration of the devices.

As described above, when mesa patterns of 1 μm or more in thickness are formed on a substrate of a {100}-plane in the <110>-direction, a vapor phase epitaxial growing method cannot bury the mesa patterns satisfactorily to allow the substrate surface to become flat. Further, the process of manufacturing semiconductor devices such as semiconductor laser diodes becomes cumbersome and complicated because of the above-described reasons. Moreover, the degree of freedom in the design of such devices is lowered.

On the other hand, such semiconductor devices have received practical applications that utilizes phenomena such as light emission, light reception, and light amplification. These are achieved simply by applying bias voltages to a p-n junction of each semiconductor device. Such semiconductor devices are strongly required to achieve higher performance along with an increase in the processing speed of information. Particularly, the requirements for high speed response characteristics are significant. Thus, the research and development on these characteristics have been actively carried out in recent years.

In order to realize high speed response characteristics, semiconductor elements are required to be integrated on one single plane. This is generally called a planar structure. Further, it is necessary to reduce parasitic capacitance by using a high resistance semiconductor substrate. The semiconductor laser diodes of the conventional planar structure have already been disclosed in Japanese Patent Publications No. 55-111188 and No. 62-112390. The optical sensors have also been disclosed in the transactions of "Opto Electronics Conference '86, P6". Hereinafter, the conventional technology on these will be briefly described with reference to FIGS. 10 and 11.

Figure 10:
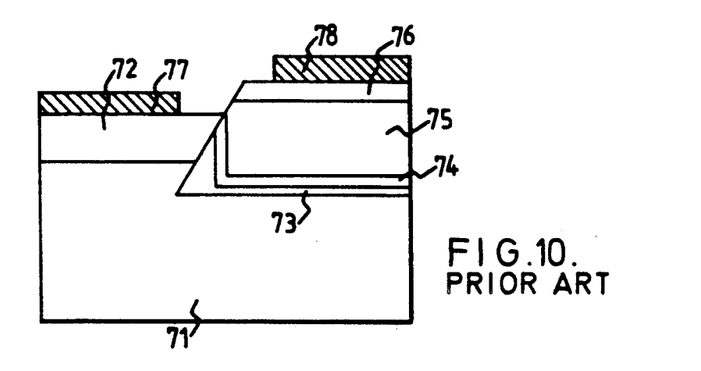
FIGS. 10 and 11 are cross-sectional views illustrating conventional examples.

In FIG. 10, reference numeral 71 represents a semi-insulating substrate,, and 72 represents a n-type semiconductor that forms steps together with the substrate 71. Reference numerals 73 through 76 represent p-type semiconductor layers formed on the step portions, and 77 and 78 represent electrodes. This structure has the following problems. Because of steps formed on the surface of elements, it is difficult to perform microscopic processing in terms of integration. Since the electrodes are formed on the respective semiconductor layers, parasitic capacitance thereabout is large. If bonding pads or electrodes are formed on the semi-insulating substrate to reduce the parasitic capacitance thereabout, the number of step portions inevitably increases.

Figure 11:
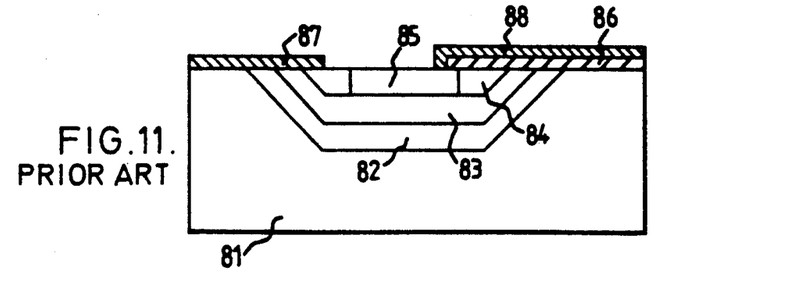

In FIG. 11, 81 represents a high-resistance semiconductor substrate, and 82 through 84 represent n-type semiconductor layers formed in the concave portion of the substrate 81. Reference numeral 85 represents a p-type diffusion layer formed selectively on the layer 84, and 86 represents an insulating film, then 87 and 88 represent electrodes. This structure has the following problems. In order to form gradual inclinations in the concave portion of the substrate 81, a high technical skill in manufacturing is necessary. For instance, Ar ion beam etching or two-layer photoresist processing is required. Moreover, the contact areas of the electrodes 87 and 88 with respect to semiconductor layers 82 through 84 are small. Thus, the contact resistance therebetween is high. Further, parasitic capacitance exists between the electrode 88 and the semiconductor layers 82 through 84 which are present on opposite sides of the insulating film 86.

As described above, in a semiconductor device of a planar structure, there have been the following problems. The steps formed on the surface of elements are disadvantageous to integration. The parasitic capacitance between the elements cannot be sufficiently reduced. The contact resistance between the electrodes and the semiconductor layer is high. Further, the process of manufacturing the devices becomes cumbersome and complicated.

SUMMARY OF THE INVENTION

Accordingly, one object of this invention is to provide a semiconductor device having steps formed on a compound semiconductor substrate, and the steps are satisfactorily buried by growing semiconductor crystal layer so as to obtain a flat surface. This invention also provide a method of manufacturing such a device.

Briefly, in accordance with one aspect of this invention, there is provided a semiconductor device wherein a substrate surface is substantially in a plane of {100}-orientation, and steps are formed on the substrate surface. The side of each step is formed in a direction deviated substantially by 5 degrees from a <110>-direction. Further, semiconductor crystal layers are additionally formed so as to bury the steps.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

In accordance with the present invention, mesa patterns formed on a compound semiconductor substrate can be buried satisfactorily by growing compound semiconductor crystal layers. Further, even when the thickness of the mesa patterns is 1 $\mu$m or more, such compound semiconductor crystal growth can be similarly performed. The reason is that the crystal growth rate is varied depending on the plane orientation. Specifically, in the case of a conventional mesa pattern of a <110>-direction, the side of the mesa pattern is of a {111}-plane because the surface of the substrate is of a {100}-plane. Further, the crystal growth rate in a direction along the {111}-plane is considerably large. Thus, some projections grow in a direction along the side of the mesa pattern. To the contrary, according to the present invention, the longitudinal direction of the mesa pattern is positively deviated from the <110>-direction. This causes the {111}-plane to disappear from the side of the mesa pattern. Therefore, the growth of the projections is suppressed. As a result, the mesa pattern can be buried satisfactorily so as to obtain a flat surface. In this case, the resonator plane is not completely perpendicular to the longitudinal direction of the mesa pattern. Thus, the efficiency of reflection on the resonator plane is slightly lowered. However, laser oscillation can be assuredly obtained. The inventors of this invention have confirmed these phenomena on experiment.

Referring now to the drawings, wherein like reference numerals designate identical or corresponding parts throughout the several views, and more particularly to FIG. 1 thereof, one embodiment of this invention will be described together with conventional examples for the sake of comparison.

Figure 1:
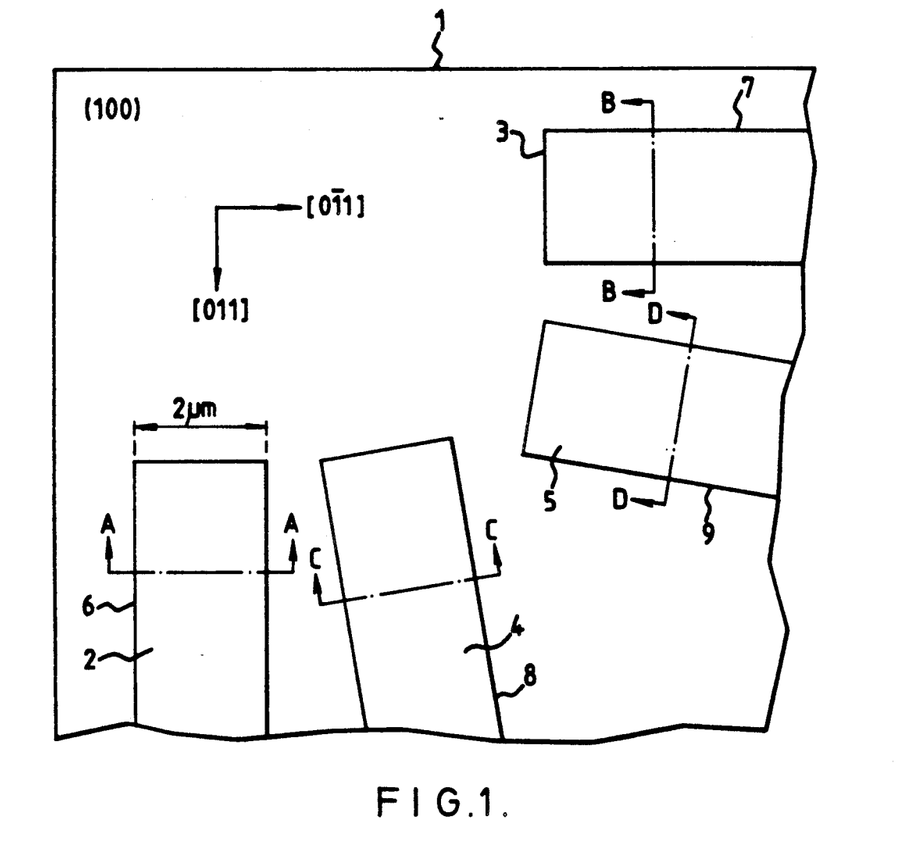
FIG. 1 is a plan view illustrating a semiconductor substrate with steps formed thereon for explaining one embodiment according to the present invention and also conventional steps for the sake of comparison.

As shown in FIG. 1, on an InP substrate 1 of a (100)-plane, SiO$_2$ films 2 through 5 are formed as rectangular masks. Thereafter, the substrate 1 is selectively etched with masks of the SiO$_2$ films 2 through 5 so as to form rectangular mesa patterns 6 through 9. The substrate 1 may also be a substrate having an InP layer formed on the surface thereof. Further, mesa patterns may be formed on this InP layer. The widths and thickness of the mesa patterns 6 through 9 are respectively about 2 $\mu$m. The longitudinal direction of the mesa pattern 6 is in a [011]-direction. The longitudinal direction of the mesa pattern 7 is in a [0$\bar{1}$1]-direction. The longitudinal direction of the mesa pattern 8 is in a direction deviated by 15 degrees from the [011]-direction. The stripe of the mesa pattern 34 is in a direction deviated by 15 degrees from the [0$\bar{1}$1]-direction.

Figure 2A:
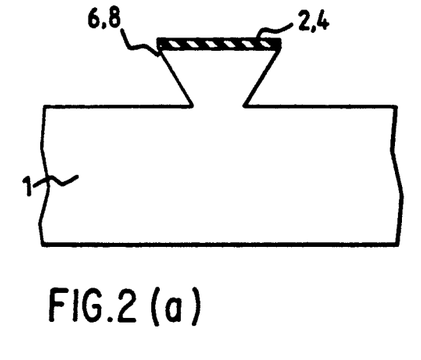
FIG. 2a is a cross-sectional view taken along lines A—A and C—C of FIG. 1.
Figure 2B:
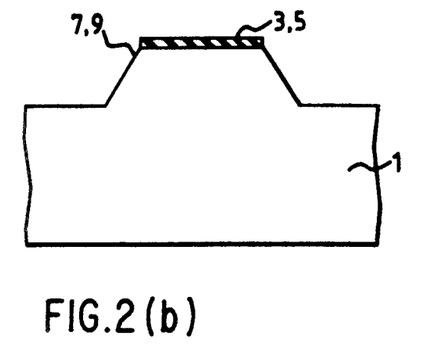
FIG. 2b is a cross-sectional view taken along lines B—B and D—D of FIG. 1.

A cross-sectional view taken along line A—A and a cross-sectional view taken along line C—C, both of FIG. 1 are in the same shape called a reverse mesa as shown in FIG. 2a. A cross-sectional view taken along line B—B and a cross-sectional view taken along line C—C are in the same shape called a mesa as shown in FIG. 2b. The sides of the mesa patterns 6 and 7 (conventional examples for comparison) are in a {111}-plane. The sides of the mesa patterns 8 and 9 are in a plane deviated from the {111}-plane. In this embodiment, the mesa patterns are made only of InP. However, in the actual manufacturing process of semiconductor laser diodes, other compound semiconductors may also be used. Specifically, other compound semiconductors which match with InP in terms of a lattice form may be used together with InP so as to form a so-called heterostructure.

Figure 3A:
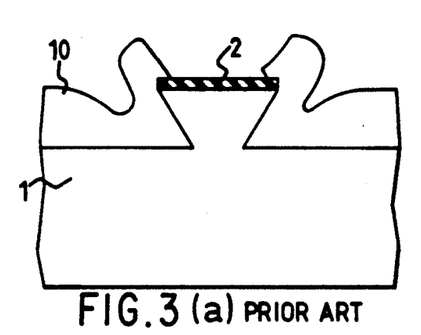
FIG. 3a is a cross-sectional view illustrating a conventional example observed after the growth of semiconductor crystal layers on the substrate shown in FIG. 2a illustrating the cross-sectional view taken along line A—A of FIG. 1.
Figure 3B:
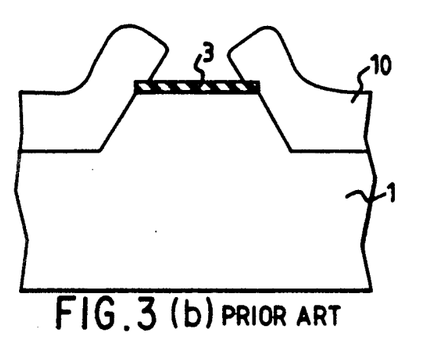
FIG. 3b is a cross-sectional view illustrating a conventional example observed after the growth of semiconductor crystal layers on the substrate shown in FIG. 2b illustrating the cross-sectional view taken along line B—B of FIG. 1.
Figure 3C:
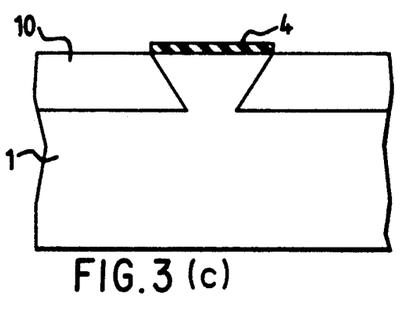
FIG. 3c is a cross-sectional view illustrating one embodiment according to the present invention observed after the growth of semiconductor crystal layers on the substrate shown in FIG. 2a illustrating the cross-sectional view taken along line C—C of FIG. 1.
Figure 3D:
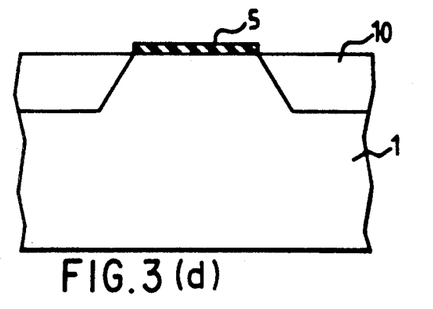
FIG. 3d is a cross-sectional view illustrating one embodiment according to the present invention observed after the growth of semiconductor crystal layers on the substrate shown in FIG. 2b illustrating the cross-sectional view taken along line D—D of FIG. 1.

The sides of the mesa patterns 6 through 7 are buried by InP crystal layers 10 which are grown by the use of MOCVD (metalorganic chemical vapor deposition). In this case, a mixed gas of TMI (trimethylindium) and PH$_3$ (phosphine) is used as a material gas. The thickness of the crystal layers grown by this process is about 2 μm. The states where InP crystal layers 10 deposit are shown in FIGS. 3a through 3d. FIG. 3a shows a cross-section taken along line A—A of FIG. 1. FIG. 3b shows a cross-section taken along line B—B of FIG. 1. FIG. 3c shows a cross-section taken along line C—C of FIG. 1. FIG. 3d shows a cross-section taken along line D—D of FIG. 1.

The longitudinal direction of the mesa patterns 6 and 7 are in the same direction as those in the conventional case, i.e., respectively in the [011]-direction and in the [0$\bar{1}$1]-direction. In this case, projections grow along the sides of the mesa patterns 6 and 7. Thus, the InP crystal layers 10 cannot grow satisfactorily to bury the mesa patterns 6 and 7 as shown in FIGS. 3a and 3b. On the other hand, the longitudinal direction of the mesa patterns 8 and 9 are in the directions respectively deviated by 15 degrees from the [011]-direction and the [0$\bar{1}$1]-direction. In this case, substantially no projections grow along the sides of the mesa patterns 8 and 9. Thus, the InP crystal layers 10 can grow satisfactorily to bury the mesa patterns 8 and 9 so as to obtain a flat surface as shown in FIGS. 3c and 3d. This is because the sides of the mesa patterns 6 and 7 are in the {111}-plane, while the sides of the mesa patterns 8 and 9 are in the planes deviated from the {111}-plane. Thus, the growth of the InP crystal layers 10 in the directions parallel to the sides of the mesa patterns 8 and 9 is relatively slower.

Next, the longitudinal directions of the mesa patterns are changed on experiment in the following manner. Specifically, the longitudinal directions thereof are determined in the directions deviated respectively from the [011] and [0$\bar{1}$1] directions by angles such as 4 degrees, 5 degrees, 15 degrees, 30 degrees, and 45 degrees. As a result, the following phenomena have been confirmed. Specifically, when the directions are deviated by 5 degrees or more (in other words, 85 degrees or less when observed from other sides), substantially no projections grow along the sides of the mesa patterns.

In the experiment, the longitudinal directions of the mesa patterns were not accurately perpendicular to the resonator plane of the (100)-plane. However, a semiconductor laser diode manufactured by the use of such mesa patterns has exhibited satisfactory characteristics as a semiconductor laser diode. Moreover, the resonator plane was formed not by a cleavage but by etching process. Therefore, the longitudinal direction, which was deviated from the [011]-direction or the [0$\bar{1}$1]-direction by 5 degrees or more, could intersect perpendicularly to the thus formed resonator plane.

In the case when a semiconductor laser diode with buried mesa patterns is manufactured, or when minute elements such as opto-electronic IC are integrated, it is required to obtain mesa patterns having satisfactory steep slopes. However, if the longitudinal direction of a mesa pattern is determined in a direction deviated from the <110>-direction by an angle exceeding 40 degrees, it becomes difficult to obtain a satisfactory slope of the mesa pattern. This will arise particularly in the case of wet-etching, for example, when etching an InP substrate by the use of hydrochloric acid. This was also confirmed by experimental result. Therefore, when the longitudinal direction of a mesa pattern is formed in a direction deviated from the <110>-direction by an angle in the range of 5 degrees to 40 degrees, a satisfactorily semiconductor device can be obtained.

Accordingly, in this embodiment, on the InP substrate of the (100)-plane, the longitudinal directions of mesa patterns can be determined in the directions deviated by 5 degrees or more respectively from the [011]-direction and the [0$\bar{1}$1]-direction. Thus, the sides of the mesa patterns can be prevented from appearance of the {111}-plane. Therefore, even when the mesa patterns are formed by a vapor phase growth method such as MOCVD, substantially no projections grow in the direction parallel to the sides thereof. Thus, the InP crystal layers can grow satisfactorily to bury the sides of the mesa patterns so as to obtain a flat surface. As a result, semiconductor laser diodes with various buried-type configurations can be readily manufactured. Further, according to the present invention, substantially no changes are necessary in the conventional manufacturing process of semiconductor laser diodes, but only the changes in the longitudinal directions of mesa patterns are required. Therefore, the method of the present invention has significant advantages in terms of ready feasibility and practicality.

As described above, according to the present invention, patterns of step portions are formed in the directions deviated by 5 degrees or more from the <110>-direction. Thus, even when the thickness of the mesa pattern is 1 μm or more, the pattern can be satisfactorily buried by the growth of semiconductor crystal layers. Therefore, the method of this invention is significantly advantageous for manufacturing semiconductor laser diodes of buried-type configurations. Moreover, this method can significantly contribute to simplifying the manufacturing process of semiconductor laser diodes, and also to enhancing the degree of freedom in designing the same.

Hereinafter, other embodiments according to the present invention will be described with reference to the drawings.

Figure 4A:
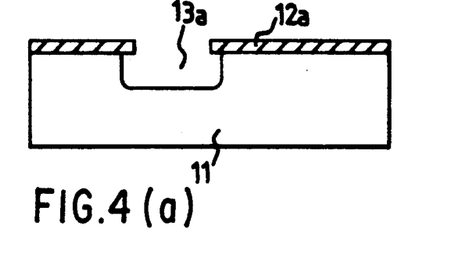
FIGS. 4a through 4i are cross-sectional views for explaining manufacturing processes of another embodiment according to the present invention.

FIGS. 4a through 4i are cross-sectional views illustrating a manufacturing process of a semiconductor laser diode according to a second embodiment of the present invention. In FIG. 4a, a silicon nitride (SiN) film 12a of 2000 Å thick is selectively formed as a mask on a high-resistivity InP substrate 11 (high-resistivity semiconductor substrate). Thereafter, the substrate 11 is etched by the use of a mixed solution of hydrochloric acid and phosphoric acid. Thus, a first concave portion 13a of about 1 to 1.5 μm deep is formed. At the same time, an eaves-shaped portion of the SiN film 12a remains. Further, the inner walls of the concave portion 13a are formed in a direction deviated by 15 degrees from a <011>-direction.

Figure 4B:
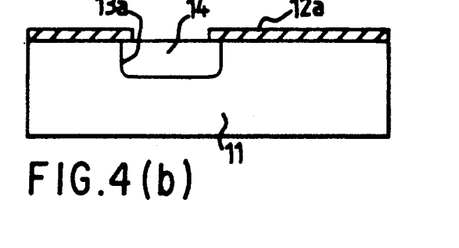

Next, as shown in FIG. 4b, the SiN film 12a is used as a mask, and a p-type InP layer (a first crystal region) 14 is buried into the concave portion 13a. This process is performed by the use of MOCVD (Metalorganic Chemical Vapor Deposition) until the layer 14 grows to become level with the surface of substrate 11. Here, the p-type InP crystal has an impurity concentration of about $5 \times 10^{17}$ cm$^{-3}$.

Figure 4C:
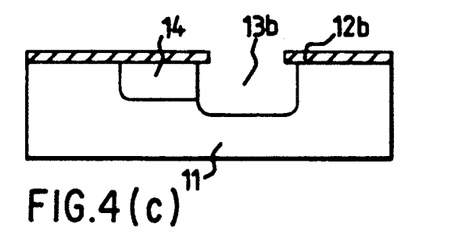

Next, as shown in FIG. 4c, a SiN film 12b is newly formed as a mask on the InP substrate after elimination of the SiN film 12a by etching. Thereafter, a second concave portion 13b is formed by etching on the substrate 11. In this process, a partial portion of the p-type InP layer 14 is also etched. However, the concave portion 13b is etched deeper than the concave portion 13a formed in the process of FIG. 4a. Further, an eaves-shaped portion of the SiN film 12b remains similarly to the process of FIG. 4a. The inner walls of the second concave portion 13b are also formed in a direction deviated by 15 degrees from the <011>-direction.

Figure 4D:
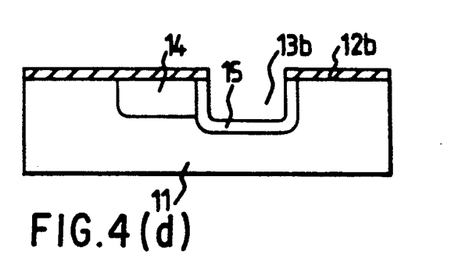

Next, as shown in FIG. 4d, the SiN film 12b is still used as a mask. Here, an undoped InP layer (not shown, but of about 0.1 μm thick) and an InGaAsP activated layer (a second crystal region) 15 of about 0.1 μm thick are formed by crystal growth in accordance with MOCVD. In this method, the sidewalls and the bottom portion of the concave portion 13b are formed substantially equal in thickness. Further, an abnormal crystal growth which occur towards the surface of the substrate 11 from the sidewalls of the concave portion 13b can be effectively prevented by the eaves-shaped portion of the SiN film 12b. The undoped InP layer functions as a buffer layer. Namely, once the InP surface is etched, and then, the undoped InP layer is formed on the InP surface before the InGaAsP activated layer is formed by crystal growth.

Figure 4E:
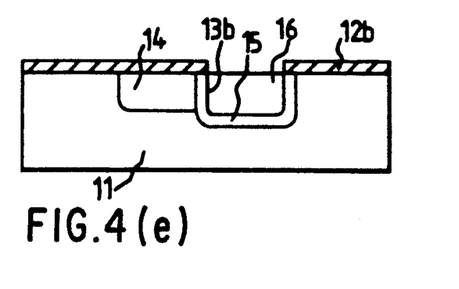

Next, as shown in FIG. 4e, an n-type InP type layer (a third crystal region) 16 is formed on the InGaAsP activated layer 15 in accordance with MOCVD. The n-type InP type crystal 16 has an impurity concentration of about $5 \times 10^{17}$ cm$^{-3}$. The layer 16 is formed continuously on the activated layer 15 until the layer 16 becomes level with the surface of substrate 11.

Figure 4F:
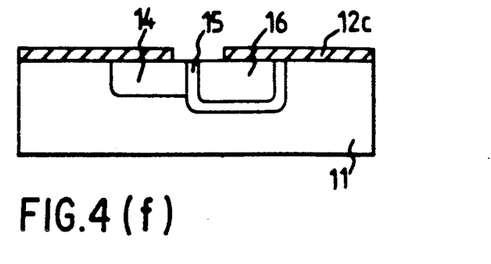

Next, as shown in FIG. 4f, a SiN film 12c is newly formed as a mask on the surface of substrate 11 after elimination of the SiN film 12b by etching. The SiN film 12c is selectively formed such that the respective partial portions of the p-type InP layer 14, the InGaAsP layer 15 and the n-type InP layer 16 are exposed.

Figure 4G:
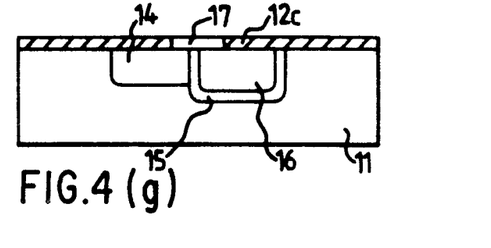

Next, as shown in FIG. 4g, the SiN film 12c is used as a mask, and a high-resistivity InP layer (a fourth crystal region) 17 is selectively formed on the surface of substrate 11. The high-resistivity InP layer 17 is formed such that an undoped InP crystal or Fe-doped InP crystal, either of about 0.2 μm thick is formed by the use of MOCVD.

Figure 4H:
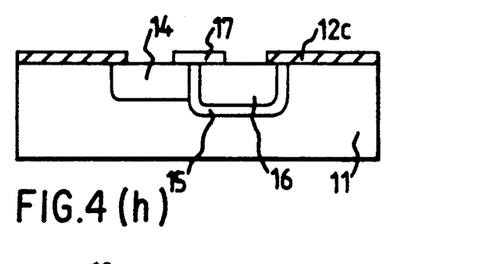
Figure 4I:
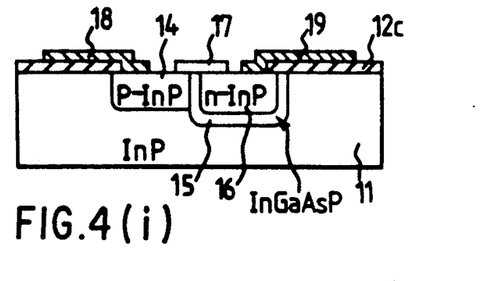

Next, as shown in FIG. 4h, window portions are provided on the SiN film 12c. Thereafter, as shown in FIG. 4i, a p-side electrode 18 and an n-side electrode 19 are formed. The most parts of the respective electrodes 18 and 19 are formed on the SiN film 12c provided on the substrate 11 except the portions which are in contact respectively with the crystal 14 and the crystal 16.

As a result, the contact area between the electrode 18 and the p-type layer 14 or the contact area between the electrode 19 and the n-type layer 16 can be reduced to a minimum.

A laser diode manufactured in the above-described manner has been improved in parasite capacitance. Specifically, the parasitic capacitance in the vicinity of the electrodes or bonding pads is significantly reduced to 0.01 pF, i.e., about 1/100 times that of the conventional laser diode. Further, the laser diode obtained in this embodiment has a configuration with no step portions. This allows a monolithic integration with other semiconductor elements such as field effect transistors, and light-sensing elements to be formed in a complete planar configuration. In addition, the thus obtained laser diode can be used for modulation of 15 GHz, i.e., about three times the conventional frequency to be modulated. Further, appropriate selections of substrate surface orientation and the concave portion inner-wall direction can prevent abnormal crystal growth within the concave portion. The selections can also allow the substrate surface to become flat.

Figure 5:
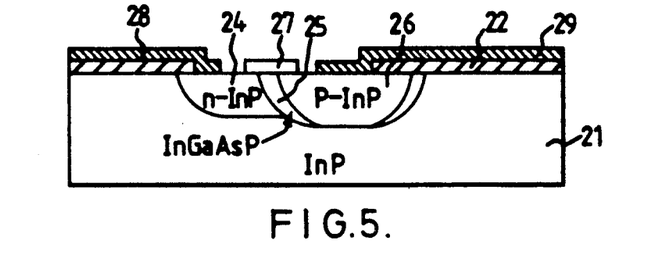
FIG. 5 is a cross-sectional view illustrating another embodiment according to the present invention.

FIG. 5 is a cross-sectional view illustrating a schematic configuration of a third embodiment according to the present invention. The third embodiment differs from the second embodiment in that an etching method to form concave portions, and a selective crystal growing method to bury the concave portions.

In the third embodiment, a mixed solution of hydrogen bromide, bromine and water is used to form concave portions on a substrate. Thus, the concave portions can be formed with a gradual inclination. Within these concave portions, an InGaAsP layer, which is a second crystal region, is formed by the use of hydride vapor deposition. In this case, the differences in thickness are observed between the sidewalls and bottoms of the concave portions. This is because a crystal growth rate differs depending on the crystal plane orientation. Specifically, the sidewalls of the concave portion grow ten times faster than the bottom thereof.

In FIG. 5, on a high resistivity semiconductor substrate 21, an n-type InP crystal (a first crystal region) 24 is selectively formed. Further, an undoped InP layer (not shown) and an undoped InGaAsP activated layer (a second crystal region) 25, and a p-type InP crystal (a third crystal region) 26 are selectively formed on the substrate 21. Moreover, a high resistance InP crystal (a fourth crystal region) 27, an SiN insulating film 22, n-type electrode 28, and a p-type electrode 29 are formed on the substrate 21.

In this embodiment, the following advantages can be obtained in addition to those of the second embodiment. In general, Zn is used as impurity in a p-type crystal growing process. However, Zn has a high diffusion coefficient. Thus, it is preferable to perform a p-type crystal growing process later than an n-type crystal growing process in light of controllability. Nevertheless, in the configuration of the second embodiment shown in FIG. 4i, particularly when the second crystal region 15 is of an n-type, if the p-type crystal growing process is performed later, the p-n junction area becomes larger. Thus, the parasitic capacitance thereabout increases and the current density decreases. Therefore, the bottoms of the concave portions are formed significantly thinner, as thin as 0.02 μm or less. This can be achieved by advantageous use of MOCVD in which the crystal growth rate is dependent on the crystal orientation. This can realize a semiconductor laser diode having characteristics superior to those in the second embodiment. This is because, in addition to a superior controllability of crystal growth, the diffusion of Fe impurity contained in the substrate allows the second thin crystal region formed on the bottom of the concave portion to be of high resistance.

Figure 6:
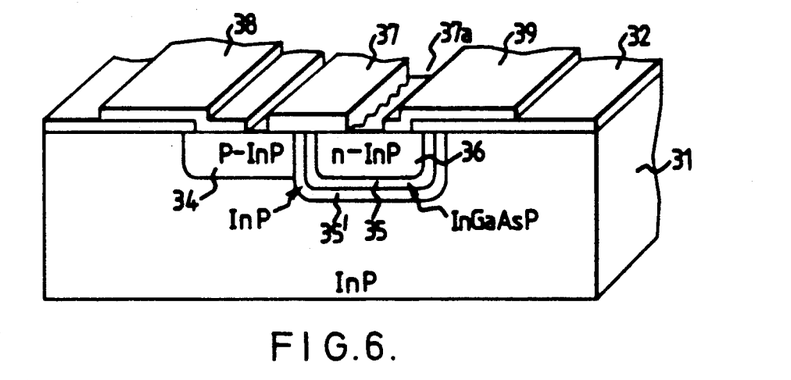
FIG. 6 is a perspective view illustrating still another embodiment according to the present invention.

FIG. 6 is a perspective diagram illustrating a schematic configuration of a distributed feed-back type laser diode of a fourth embodiment according to the present invention. In FIG. 6, the distributed feed-back type laser diode includes an simi-insulating InP substrate (high resistivity semiconductor substrate) 31 having a surface of (100)-orientation, an SiN insulating film 32, and a p-type InP layer (a first crystal region) 34. The semiconductor laser diode further includes an undoped InP layer 35′, an undoped In Ga As P activated layer (a second crystal region) 35, and an n-type InP layer (a third crystal region) 36. The semiconductor laser diode still further includes a high resistivity InP layer (a fourth crystal region) 37, a p-type electrode 38, an n-type electrode 39, and a diffraction grating 37a. The inner walls of the concave portions of the InP substrate 31, on which the p-type InP layer 34 and the undoped InP layer 35' are respectively formed, are deviated by 15 degrees from the <011>-direction.

The diffraction grating 37a is formed adjoining the fourth crystal region 37 in the process similar to the process shown in FIG. 4f or FIG. 4g of the second embodiment. This formation can constitute the distributed feed-back type laser diode. The laser diode has advantages in that even after the major crystal growing process including activated layer formation, the diffraction grating 37a can be formed with predetermined design values. Therefore, the periodic arrangements in three-dimensional space of the diffraction grating 37a can be appropriately selected. As a result, a laser beam of any required wavelengths can be readily obtained from the same substrate. Thus, the diffraction grating 37a exhibits a satisfactory diffraction efficiency if it is formed after the process of etching the activated layers and the crystals. Specifically, after the surfaces of the p-type InP crystal 34, the undoped InP layer 35', the undoped InGaAsP activated layer 35, and the n-type InP crystal 36 are etched by about 0.2 μm.

In this embodiment, an $SiO_2$ insulating film can be formed instead of the fourth crystal region 37. This can simplify the manufacturing process of the laser diode without any problems in terms of its response characteristics. Further, when contact layers including In, Ga, As and P (not shown) are provided on the surface of the first crystal region 34 and the third crystal region 36, the contact resistance of the electrodes 38 and 39 with respect to such regions can be significantly reduced.

Figure 7:
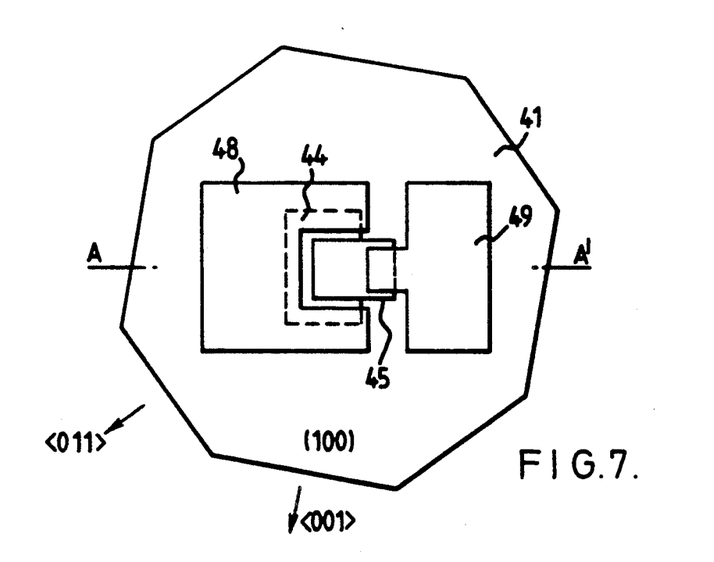
FIG. 7 is a plan view illustrating another embodiment according to the present invention.
Figure 8:
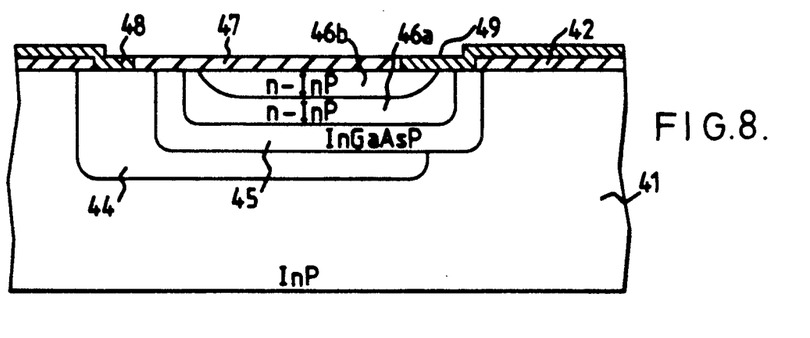
FIG. 8 is a cross-sectional view taken along line A—A' of FIG. 7.

FIG. 7 is a plan view illustrating a schematic configuration of a photo-diode according to a fifth embodiment of the present invention. FIG. 8 is a cross-sectional view taken along line A—A' of FIG. 7. In this embodiment, the side directions of the concave portions are determined to the specified crystal direction. This prevents abnormal growths of crystals forming within the concave portions.

First, a high resistivity InP substrate 41 having a main plane of a (100)-plane is prepared. The InP substrate 41 of FIG. 7 is illustrated as an octagon for explaining crystal orientations thereof. In FIG. 7, a plane perpendicular to a <011>-direction is a cleavage plane.

Next, an SiN film (not shown) having a rectangular window is formed on the main plane. In this case, a pattern is formed such that the respective sides of the rectangle do not become parallel to the <011>-direction. Thereafter, a concave portion of about 4 μm deep is formed on the InP substrate 41 by the use of this rectangular pattern. Then, the thus formed concave portion is filled up so as to form a first crystal region 44 by performing a selective crystal growth in accordance with MOCVD. The first crystal region 44 is a p-type InP layer having an impurity concentration of $1 \times 10^{18}$ cm$^{-3}$.

Next, an SiN film 42 having a new rectangular window is formed on the InP substrate 41. The rectangular pattern of the SiN film 42 is formed such that one side of the rectangular pattern does not become parallel to the <011>-direction. Further, a partial portion of the rectangular pattern is aligned so as to be superimposed on the first crystal region 44.

Next, the SiN film 42 is used as a mask, and partial portions of the first crystal region 44 and the InP substrate 41 are simultaneously etched. This etching process is performed by the use of an acid-mixed solution so as to form respective concave portions of about 3 μm deep. Further, the SiN film 42 is used as a mask. Thereafter, a selective crystal growth processing is performed by the use of MOCVD with respect to the thus formed concave portions. The selective crystal growing process forms an n-type InGaAsP layer 45 of 1.7 μm thick having a concentration of $7 \times 10^{14}$ cm$^{-3}$ along the concave portion. The layer 45 functions as a beam-absorption layer in the wavelength range of 1.3 to 1.55 μm, and it is called a second crystal region. Further, an InP buffer layer (not shown) of about 0.3 μm may be formed prior to formation of the InGaAsP layer 45.

Next, on the layer 45, an n-type InP layer 46a of about 1 μm thick having a concentration of $2 \times 10^{16}$ cm$^{-3}$ is formed. Thereafter, on the layer 46a, an n-type InP layer 46b of about 0.3 μm thick having a concentration of $1 \times 10^{18}$ cm$^{-3}$ is formed. Thus, the above-described concave portion is filled up. These n-type InP layers 46a and 46b are together called a third crystal region. Then, an $SiN_2$ film 47 is formed on the surfaces of the first and third crystal regions. Further, a p-type electrode 48 and an n-type electrode 49 are respectively formed on the surfaces of the first and third crystal regions.

The electrode leads of the photo-diode manufactured in this embodiment are formed on the SiN insulating film 42 formed on the substrate 41, and have substantially no parasitic capacitance. Further, the electrodes 48 and 49 are respectively provided with larger contact areas compared to those of the conventional photo-diode. Thus, the contact resistance of the electrodes 48 and 49 are significantly reduced. These advantages result in response characteristics of the photo-diodes several times faster than those of the conventional ones.

Figure 9:
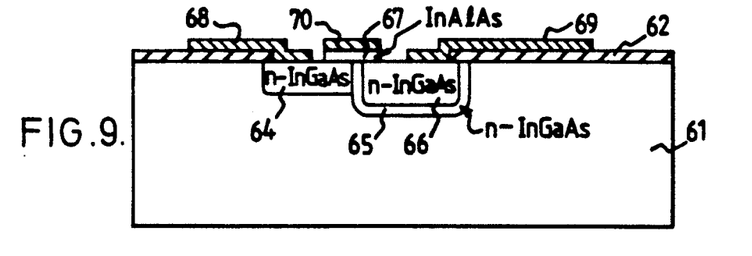
FIG. 9 is a cross-sectional view illustrating still another embodiment according to the present invention.

FIG. 9 is a cross-sectional view illustrating a schematic configuration of a field effect transistor according to a sixth embodiment of the present invention. In this embodiment, similarly to the processings of FIGS. 4a through FIG. 4h, selective etchings and selective crystal growing processes are performed. As shown in FIG. 9, on a high resistance substrate 61, an n-type InGaAs layer (a first crystal region) 64 having an impurity concentration of $2 \times 10^{17}$ cm$^{-3}$, an n-type InGAs layer (a second crystal region) 65 of 0.8 μm thick having an impurity concentration of $1 \times 10^{16}$ cm$^{-3}$, and an n-type InGaAs layer (a third crystal region) 66 having an impurity concentration of $2 \times 10^{17}$ cm$^{-3}$ are respectively formed. The inner walls of the concave portions of the substrate 61, on which the n-type InGaAs layer 64 and the n-type InGaAs layer 65 are respectively formed, are deviated by 15 degrees from the <011>-direction. Thereafter, an undoped InAlAs layer of 0.05 μm thick is formed as a fourth crystal region 67. The fourth crystal region 67 is formed so as to cover partial portions of the first to third crystal regions 64 and 65.

Next, an AuGe source electrode 68 and an AuGe drain electrode 69 are formed. Further, an Al gate electrode 70 is formed. As a result, a field effect transistor (FET) is completed.

The thus manufactured FET has a channel length determined by the film thickness of the second crystal region 65. Thus, the channel length can be predetermined more accurately by far than that of the conventional FET. Specifically, in the conventional configuration, a channel length cannot be manufactured shorter than about 1 μm because of inevitable restrictions in photo-lithography. However, according to this embodiment, an FET having a channel length shorter than 1 μm can be readily realized.

As described above, according to the present invention, parasitic capacitances of semiconductor devices can be significantly reduced. In addition, a planar configuration thereof can be realized. Thus, semiconductor laser diodes, light-sensing elements and FETs respectively having high-speed response characteristics can be readily manufactured. By virtue of the planar configuration having no step portions, semiconductor laser diodes, light-sensing elements and FETs can be combined on the same substrate. This can achieve a so-called opto-electronics integrated device. The opto-electronics integrated device is significantly effective in terms of mutual inductance. Thus, it has superior characteristics as a semiconductor device for ultra high-speed optical communication. The present invention is especially effective for a compound semiconductor of InP system.

However, the present invention is not limited to the above-described embodiment. For example, the materials used for the compound semiconductor substrate and the compound semiconductor crystal layers to be grown are not limited to InP. However, other compound semiconductor materials such as GaInAs, GaInAsP, AlInAs, AlInP, AlInGaP, AlGaInAs and GaAs may also be used. Further, in the case of a so-called hetero-growth in which different materials are respectively used for a semiconductor substrate and semiconductor crystal layers to be grown, the method to this invention can also be effectively used. In addition, the material of mesa portions on the substrate is not limited to a single semiconductor but any hetero-structures, which are formed by depositing semiconductors of different kinds, may also used. Moreover, the growth of the semiconductor crystal layers can be achieved by any vapor phase growing methods other than MOCVD. Further, the shape of mesa patterns is not limited to a rectangle, but a square may also be used.

Furthermore, the plane orientation of the substrate surface is not limited to the (100)-plane orientation, but an orientation equivalent to this, i.e., a {100}-plane may also be used. Moreover, the (100)-plane and to a plane deviated by some degrees, about 5 degrees for example, from a plane equivalent to the (100)-plane may also be used. Similarly, the crystal axis direction from which the mesa direction is deviated is not limited to [011]-direction and [0$\bar{1}$1]-direction, but any directions equivalent to this, i.e., a <110>-direction may also be used. In other words, the reference axis direction is included within the <110>-direction, and it is in parallel to the substrate surface. Other various modifications can be practiced unless otherwise they are not deviated from the scope of this invention.

What is claimed is:

1. A method of manufacturing semiconductor devices comprising the steps of:

providing a high-resistivity compound semiconductor substrate;

forming a first concave portion in a surface of said compound semiconductor substrate;

forming a first compound semiconductor layer within said concave portion by use of a vapor phase growing method until the surface of said first compound semiconductor layer reaches the substrate surface;

forming a second concave portion deeper than said first concave portion, said second concave portion including a portion of said first compound semiconductor layer;

forming a second compound semiconductor layer on inner walls of said second concave portion by use of a vapor phase growing method so as to form a third concave portion; and forming a third compound semiconductor layer within said third concave portion by use of a vapor phase growing method until the surface of said third compound semiconductor layer reaches said substrate surface;

said step of providing said substrate including the step of limiting the substrate surface orientation substantially to a {100}-orientation; and said steps of forming said first through third concave portions including the steps of limiting the respective sides of said first through third concave portions substantially to a direction deviated from the <110>-direction by 5 degrees or more.

2. The method of claim 1, wherein the step of forming said first through third compound semiconductor layers includes the step of forming said layers by the use of MOCVD (metalorganic chemical vapor deposition).

3. The method of claim 2, wherein the step of providing said compound semiconductor substrate includes the step of limiting said substrate to a compound semiconductor substrate having InP, and the steps of forming said first through third compound semiconductor layers include the step of limiting said first layer to a compound semiconductor layer having n-type InP, the step of limiting said second layer to a compound semiconductor layer having InGaAsP, and the step of limiting said third layer to a compound semiconductor layer having p-type InP.

* * * * *